(12) United States Patent
Erokhin et al.

(10) Patent No.: US 7,294,561 B2
(45) Date of Patent: Nov. 13, 2007

(54) INTERNAL GETTERING IN SIMOX SOI SILICON SUBSTRATES

(75) Inventors: Yuri Erokhin, Newburyport, MA (US); Kevin J. Dempsey, Somerville, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/640,917

(22) Filed: Aug. 14, 2003

(65) Prior Publication Data

US 2005/0037596 A1 Feb. 17, 2005

(51) Int. Cl.
H01L 21/322 (2006.01)
(52) U.S. Cl. .................... 438/473; 438/471; 438/476; 257/347; 257/E21.537
(58) Field of Classification Search ................ 438/143, 438/402, 471, 473–475; 257/347
See application file for complete search history.

(56) References Cited

U.S. PATENT DOCUMENTS

| 4,837,172 A | 6/1989 | Kubota et al. |
| 5,455,437 A | 10/1995 | Kurio |
| 5,888,297 A | 3/1999 | Ogura |
| 5,970,366 A | 10/1999 | Okonogi |
| 6,022,793 A * | 2/2000 | Wijaranakula et al. ..... 438/473 |
| 6,083,324 A * | 7/2000 | Henley et al. ............. 148/33.2 |
| 2001/0012649 A1 | 8/2001 | Iwamatsu et al. |
| 2002/0086464 A1 | 7/2002 | Houston |

FOREIGN PATENT DOCUMENTS

| DE | 38 33 161 | 4/1990 |
| EP | 1 120 819 | 8/2001 |

OTHER PUBLICATIONS

Campisi, et al., "Heavy Metal Gettering In Simox Using Implanted Carbon," Extended Abstracts, Electrochemical Society, vol. 90-1, pp. 466-467, 1990.

* cited by examiner

*Primary Examiner*—Mary Wilczewski
*Assistant Examiner*—Christy L Novacek
(74) *Attorney, Agent, or Firm*—Thomas J. Engellenner; Reza Mollaaghababa; Nutter McClennen & Fish LLP

(57) ABSTRACT

The present invention provides methods for forming SOI wafers having internal gettering layers for sequestering metallic impurities. More particularly, in one embodiment of the invention, a plurality of sites for sequestering metallic impurities are formed in a silicon substrate by implanting a selected dose of oxygen ions therein. In one embodiment, an epitaxial layer of crystalline silicon is formed over the substrate, and a buried continuous oxide layer is generated in the epitaxial layer, for example, by employing a SIMOX process.

27 Claims, 13 Drawing Sheets

IMPLANT A DOSE OF OXYGEN IONS IN SUBSTRATE TO GENERATE A PLURALITY OF SEQUESTRATION SITES
10

FORM EPITAXIAL CRYSTALLINE LAYER OF SILICON OVER THE SUBSTRATE
20

GENERATE A CONTINUOUS INSULATING OXIDE LAYER BELOW A TOP SURFACE OF THE EPI LAYER
24

FIG. 1

IMPLANT A DOSE OF OXYGEN IONS BELOW A BACK SURFACE OF THE SUBSTRATE TO GENERATE A PLURALITY OF GETTERING SITES
44

GENERATE AN EPITAXIAL CRYSTALLINE SILICON LAYER OVER THE TOP SURFACE OF THE SUBSTRATE
46

GENERATE A CONTINUOUS BURIED OXIDE LAYER IN THE EPI LAYER
48

FIG. 5B

INTERNAL GETTERING IN SIMOX SOI SILICON SUBSTRATES

BACKGROUND OF THE INVENTION

This invention relates generally to methods for forming silicon-on-insulator (SOI) substrates, and more particularly, to methods for forming such substrates having internal sites for sequestering metallic impurities present in the substrate.

SOI wafers have become increasingly common starting substrates for generating a variety of semiconductor electronic devices. SOI wafers typically contain a device layer formed in a silicon substrate above a buried continuous silicon oxide layer that separates the device layer from the remainder of the substrate. The buried oxide layer can be generated, for example, by employing techniques generally known by the acronym SIMOX (Separation by Implantation of Oxygen). A variety of integrated circuits can be fabricated in the device layer. Such integrated circuits typically include thousands, or even millions, of devices, such as transistors or logic gates.

Silicon wafers, however, typically contain metallic impurities, such as, copper, nickel, iron, gold, chromium, or silver, among others. Trace amounts of such metallic impurities can be present in a silicon ingot from which the wafer is cut. Additionally, subsequent processing of the wafers in ion implanters, high temperature furnaces, or other wafer processing tools, employed during manufacturing of SOI wafers or in later IC processing of the wafers, can expose the wafers to metallic impurities that can originate from metallic components of these tools and/or from contaminants present in process gases and/or other chemicals.

At elevated temperatures that are routinely utilized in semiconductor IC fabrication, these metallic impurities can rapidly diffuse through the silicon substrate, and can be trapped in the device layer. Concentrations of such metallic impurities in the device layer beyond certain thresholds can adversely affect critical characteristics of semiconductor devices formed in this layer, such as, leakage current and breakdown voltage of p-n junctions, integrity of gate dielectric in MOS transistors and current gain in bipolar devices.

One method utilized in the art for lowering the concentration of metallic impurities in a wafer is to form a polycrystalline silicon layer on a back surface of the wafer. Such a polycrystalline layer functions as a precipitation region for the mobile metallic impurities. However, wafers formed with such polycrystalline layers, often referred to as "poly-back" wafers, have several limitations that make them undesirable to integrated circuit device manufacturers. For example, polycrystalline silicon surfaces are inherently rough and more likely to trap particulate contaminants from the processing environment during IC manufacturing. Further, the uneven topography of the polycrystalline layer renders measurement of particulate contamination on the poly-back layer impractical. When such wafers are stacked during processing, particles trapped by the polyback layer can also be shed to the front surfaces of adjacent wafers where active devices are formed. Many conventional wafer manufacturers, as well as some SOI wafer fabricators, have abandoned the polyback approach altogether in favor of "double-polished" wafers that include both a polished top surface as well as a polished back surface.

Another disadvantage of a poly-back wafer is that the rough surface topography of the polycrystalline surface can render precise positioning of the wafer for lithographical applications impractical.

The undesirable properties of polyback wafers thus require new approaches to achieving reduction of metallic contamination in the wafer device region, especially in SIMOX wafer manufacturing.

Hence, there is a need for enhanced methods for generating SOI wafers having low concentration of metallic impurities in the device layer.

SUMMARY OF THE INVENTION

In one aspect, the present invention provides methods for generating sequestration sites in a semiconductor substrate for sequestering metallic impurities present in the substrate. The methods of the invention also allow forming an insulating layer, distinct from the sequestration sites, in the substrate, e.g., a silicon dioxide layer in a silicon substrate, to electrically insulate an upper portion of the substrate from the bulk of the substrate. The insulating layer can be generated, for example, by implanting a selected dose of an ion, such as oxygen, into the substrate so as to create a buried oxygen-rich layer in the substrate. Subsequently, the substrate can be annealed, for example, by maintaining it at a temperature in a range of about 1100 C to about 1400 C for a period of approximately a few hours, to generate a continuous buried oxide layer in the oxygen-rich layer that is distinct from a gettering region formed by the sequestration sites.

The sequestration sites can be generated through implantation of a dose of oxygen ions in a range of about $5 \times 10^{15}$ $cm^{-2}$ to about $1 \times 10^{18}$ $cm^{-2}$, and more preferably in a range of about $5 \times 10^{15}$ $cm^{-2}$ to about $2 \times 10^{17}$ $cm^{-2}$, in the substrate by exposing it to an oxygen ion beam having an energy in a range of about 30 keV to about 300 keV, and more preferably in a range of about 120 keV to about 220 keV. In contrast, the formation of the oxygen rich region can be accomplished, for example, by exposing the substrate to a beam of oxygen ions having an energy in a range of about 40 to about 210 keV to implant an oxygen dose in a range of about $10^{16}$ $cm^{-2}$ to about $10^{18}$ $cm^{-2}$ therein.

When oxygen is used to form both the gettering region and the insulating layer, it should be apparent that the lower dose for internal gettering purposes is desirable so that a discontinuous array of metal sequestration sites are formed in the gettering region while the higher dose in the oxygen rich implant layer is desirable for the opposite reason: so that the oxygen rich layer can coalesce into a continuous buried oxide insulating layer.

In another aspect, the invention provides a method for forming a silicon-on-insulator (SOI) wafer in which a plurality of sites for sequestration of metallic impurities, herein also referred to as gettering sites, are generated. Such a method calls for generating the gettering sites below a surface of the substrate, for example, by implanting oxygen ions therein. An epitaxial layer of crystalline silicon is then grown over that substrate's surface, and a continuous buried insulating layer, e.g., a silicon dioxide layer, is formed in the epitaxial layer.

In a related aspect, methods known generally as separation by implantation of oxygen (SIMOX) can be employed for formation of a continuous silicon dioxide layer in the epitaxial layer. For example, the buried oxide layer can be formed by implanting a dose of oxygen ions in a range of about $10^{16}$ to about $10^{18}$ $cm^{-2}$ in the epitaxial layer followed by annealing the substrate at an elevated temperature, e.g., a temperature in a range of about 1100 C to about 1400 C.

In other aspects, a method of the invention for generating an insulating layer in a semiconductor substrate includes implanting a dose of oxygen ions through a back surface of the substrate to generate a plurality of gettering sites below that surface. An epitaxial crystalline layer of silicon is then grown on a top surface of the substrate, i.e., a substrate's surface opposed to the back surface. A continuous buried oxide layer is then generated in the epitaxial layer by utilizing, e.g., a SIMOX process.

In another aspect, the invention provides a method for generating an SOI substrate by forming a first set of sites for sequestering metallic impurities in a silicon wafer by implanting a first dose of oxygen in the wafer. A second set of sequestration sites can then be generated by implanting a second dose of oxygen ions into the wafer, preferably different than the first dose. Subsequently, an epitaxial layer of silicon can be grown over the wafer, and a buried continuous oxide layer can be generated within the epitaxial layer. The first set of sequestration sites can be generated by exposing the substrate to a beam of oxygen ions having a selected energy, e.g., an energy in a range of about 120 to about 220 keV, and the second set of sequestration sites can be generated by exposing the substrate to a beam of oxygen ions having a different energy.

Further understanding of the invention can be obtained by reference to the following detailed description in conjunction with the associated drawings, which are described briefly below.

BRIEF DESCRIPTION OF THE DRAWINGS

FIG. 1 is a flow chart depicting various steps for forming an SOI wafer having an internal gettering layer in accordance with one embodiment of the invention, FIG. 2A schematically depicts a substrate in which a plurality of sites for sequestering metallic impurities are formed by implanting ions therein in accordance with one embodiment of the invention, FIG. 2B schematically illustrates formation of an epitaxial crystalline silicon layer over the substrate of FIG. 2A in one step of a method of one embodiment of the invention for forming an SOI substrate having an internal gettering layer, FIG. 2C schematically illustrates exposing the epitaxial layer of the substrate of FIG. 2B to a beam of oxygen ions to generate a buried oxygen-rich layer therein, FIG. 2D schematically illustrates a SOI wafer formed in accordance with one embodiment of the invention having an internal gettering layer by annealing the substrate of FIG. 2C at an elevated temperature, FIG. 3C presents exemplary experimental data depicting concentration of nickel impurities in another SOI wafer of the invention having an internal gettering layer, FIG. 5B is a flow chart delineating exemplary steps for generating the SOI wafer schematically depicted in FIG. 5A.

DETAILED DESCRIPTION

Figure 2A:
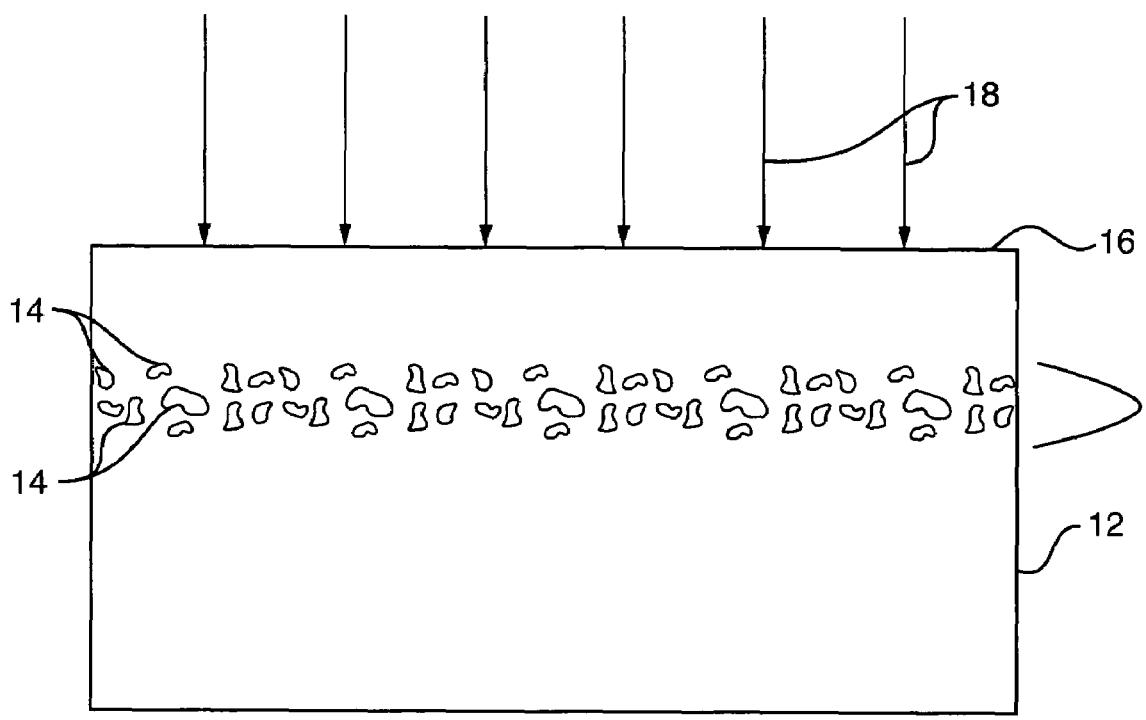

The present invention provides methods for generating sequestration sites in SOI wafers, typically at a depth below a wafer's device layer, for sequestering metallic impurities, thereby enhancing the quality of devices formed in an upper layer of the wafer. Briefly, the methods of the invention generate such sequestration sites through implantation of ions, such as oxygen, in the wafer to form oxide precipitates and/or associated structural defects that act as sequestration sites for metallic impurities. In addition to such internal sequestration sites, an SOI wafer of the invention can also include an epitaxially grown crystalline silicon layer in which a buried continuous oxide layer is generated by employing, for example, a SIMOX process.

More particularly, with reference to FIGS. 1 and 2A, in one embodiment of the invention, in an initial step 10, a dose of oxygen ions is implanted into a silicon substrate 12 to generate a plurality of sites 14 below a top surface 16 of the substrate that preferentially sequester metallic impurities, such as, atoms of nickel, iron or chromium, copper, present in the substrate, as discussed in detail below. The oxygen implantation can be accomplished by bombarding the substrate with a beam of oxygen ions 18 having an energy in a range of about 30 keV to about 300 keV, and more preferably in a range of about 120 keV to about 220 keV. The dose of the implanted oxygen ions can range from about $5 \times 10^{15}$ cm$^{-2}$ to about $1 \times 10^{18}$ cm$^{-2}$, and more preferably from about $5 \times 10^{16}$ cm$^{-2}$ to about $2 \times 10^{17}$ cm$^{-2}$. In general, the dose of the implanted oxygen is selected to be sufficiently high such that the formed precipitates can withstand subsequent annealing steps, which are typically performed at elevated temperatures.

A variety of commercially available ion implanters can be employed for this implantation step. For example, an ion implanter marketed by Ibis technology corporation of Danvers, Mass. under the trade designation IBIS 2000 can be utilized.

The implanted oxygen ions that are distributed below the top surface of the substrate around a selected depth generate oxide precipitates and/or associated structural crystal defects, such as dislocations, that can serve as heterogeneous precipitation sites for sequestering metallic impurities. In other words, metallic impurities preferentially precipitate in a region of the substrate in which $SiO_2$ precipitates and/or associated structural defects are formed. Such precipitation of metallic impurities at the sequestration sites 14 advantageously lowers the concentration of metallic impurities in other portions of the substrate, for example in a portion that is in proximity of the substrate's top surface 16. Such sequestration of impurities is also herein referred to as a gettering process, and the region of the substrate in which the gettering sites are disposed is herein referred to as a gettering layer. It should, however, be understood that in preferred embodiments of the invention, the gettering layer is not a continuous layer, but rather includes a plurality of separate sequestration sites, for example, in the form of oxide precipitates and/or associated structural defects, that provide an increased effective surface area for precipitation of metallic impurities. In other less preferred embodiments, the sequestration sites generated by ion implantation may coalesce to form a continuous or semi-continuous layer when the substrate is subjected to subsequent annealing steps, as described below.

Figure 2B:
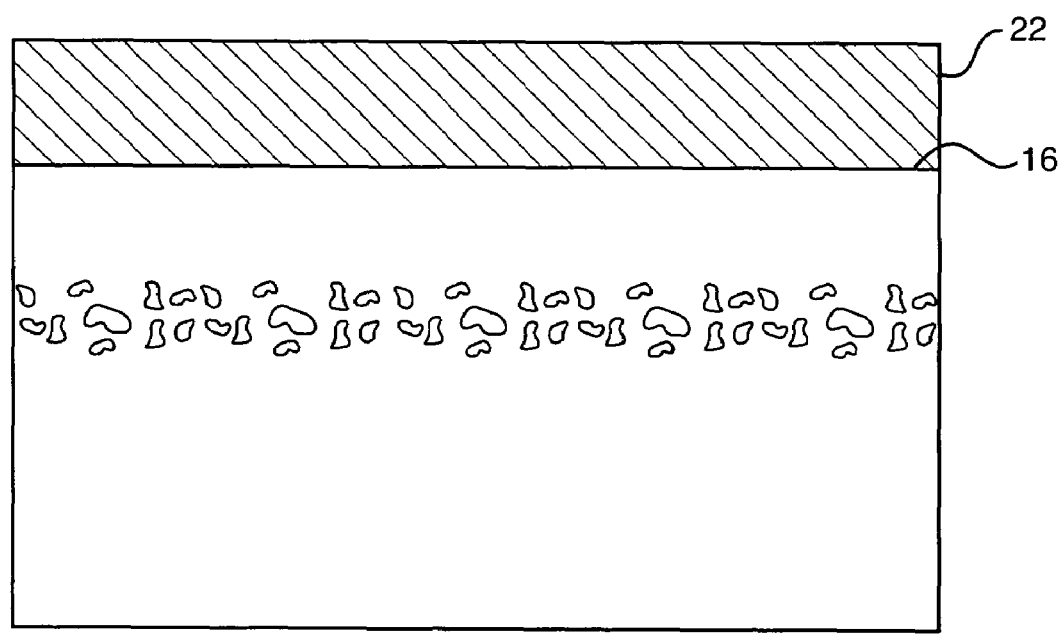

With reference to FIG. 1 and FIG. 2B, subsequent to the formation of the gettering sites 14, in a step 20, a layer 22 of crystalline silicon can be grown, for example, by an epitaxial process, on the top substrate surface 16. This crystalline silicon layer, herein referred to as an epi layer, can be generated, for example, by employing known deposition techniques, such as chemical vapor deposition (CVD). The thickness of the epi layer 22 can range, for example, from about 0.5 microns to about 10 microns. As discussed in more detail below, the epi layer provides a region of crystalline silicon in which a buried insulating layer, for example, a buried oxide layer, can be formed in order to electrically insulate an upper portion of the epi layer, in which devices can be formed, from the remainder of the substrate.

During the formation of the epitaxial layer, the substrate is typically subjected to elevated temperatures, for example, a temperature in a range of about 900° C. to about 1200° C. Such elevated temperatures not only facilitate the formation of the epi layer, but they can also stabilize the precipitation sites generated in the previous implantation step.

In some embodiments of the invention, the substrate is optionally annealed subsequent to formation of the gettering sites, and before the epitaxial layer 22 is generated, in order to stabilize the gettering sites. Such annealing of the substrate can be accomplished by maintaining the substrate at a temperature in a range of about 700° C. to about 1300° C.

Figure 2C:
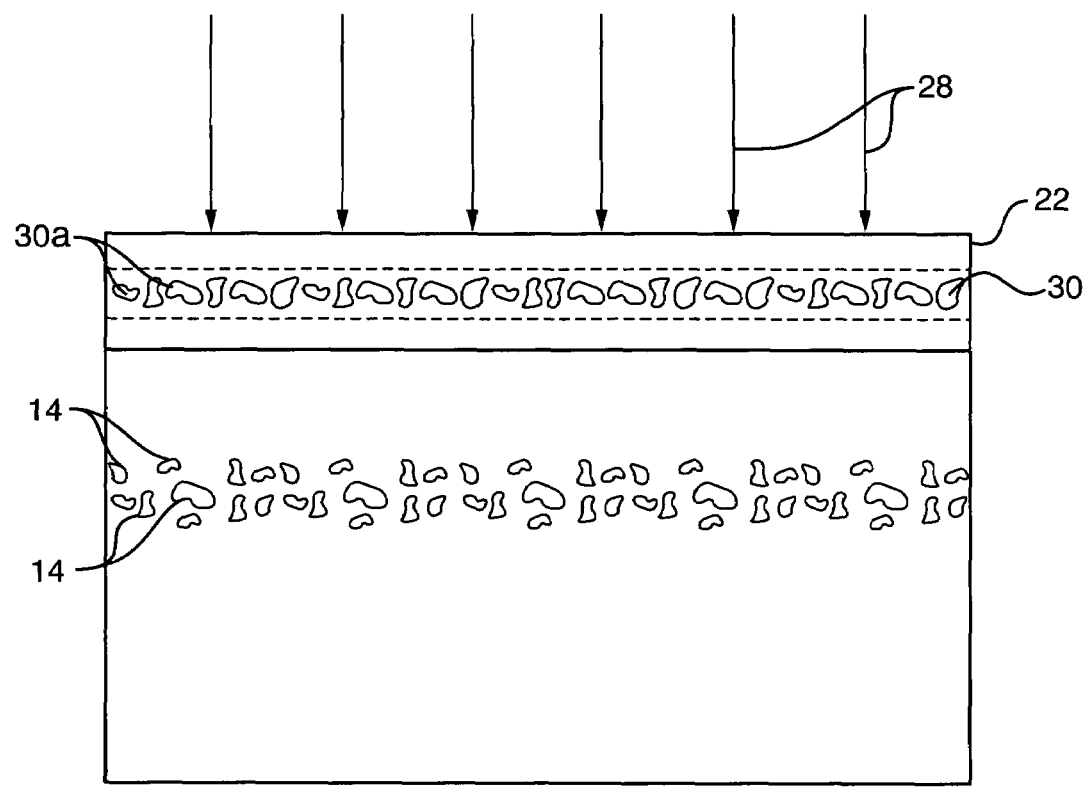
Figure 2D:
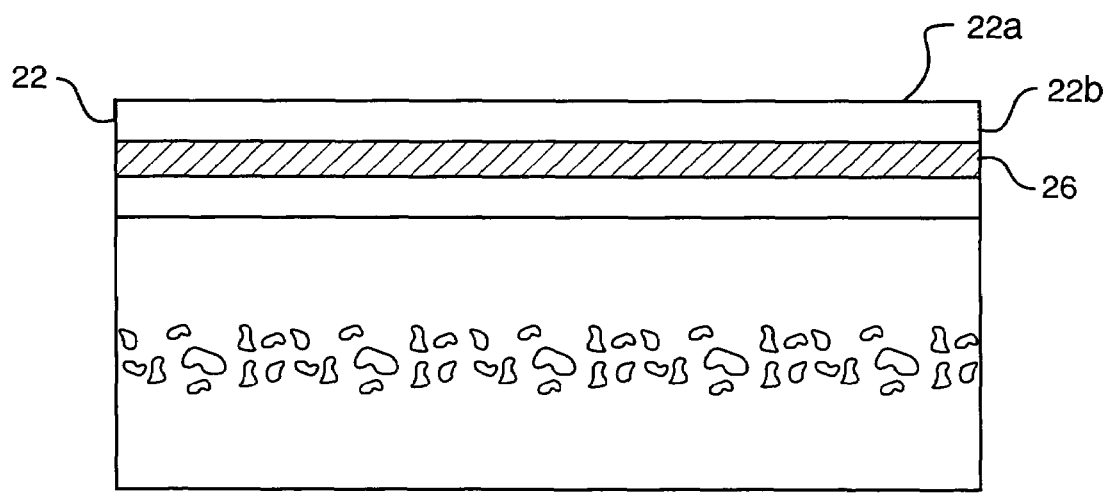

Referring to FIGS. 1, 2C and 2D, in this exemplary embodiment, in step 24, a continuous buried insulating oxide layer 26 is generated within the epi layer 22 by employing SIMOX techniques, which are well known in the art. For example, with reference to FIG. 2C, a dose of oxygen ions, e.g., in a range of about $10^{16}$ $cm^{-2}$ to about $10^{18}$ $cm^{-2}$, is implanted in the epi layer by exposing this layer to a beam oxygen ions 28 having an energy in a range of about 40 keV to about 210 keV. The ion implantation generates a buried oxygen-rich layer 30 containing islands of oxide precipitates 30a within the epi layer 22. Although in this embodiment the implantation of ions in the epi layer is performed in a single stage, in other embodiments, the implantation can be achieved in multiple stages, in each of which a selected dose of oxygen is implanted in the epi layer such that the total implanted dose is in a range of about $10^{16}$ $cm^{-2}$ to about $10^{18}$ $cm^{-2}$. Subsequently, the substrate can be subjected to an annealing process performed at an elevated temperature, for example, at a temperature in a range of about 1100 C to about 1400 C, to cause formation of chemical bonds between oxygen ions in the oxygen-rich layer 30 and the silicon atoms of the epi layer in order to coalesce the oxide precipitates in the oxygen rich layer into the continuous oxide layer 26 buried below an upper surface 22a of the epi layer. The annealing step can be performed, for example, in an atmosphere of an inert gas, e.g., argon, having a concentration of oxygen in a range of about 1% to 100%.

As discussed above, the precipitation sites 14, generated by the initial implantation step, are, however, sufficiently stable to withstand the high annealing temperatures to which the substrate is typically subjected during the formation of the continuous buried oxide layer 26.

The continuous oxide layer 26 functions as an insulating layer that separates and electrically insulates an upper region 22b of the epi layer 22 from the remainder of the substrate. A variety of electronic devices, such as, bipolar or MOS transistors, can be formed in the upper region 22b, which is also herein referred to as the device layer. Thus, the above process generates an SOI wafer having a continuous buried oxide layer formed in an epi layer, and a gettering layer formed of a plurality of precipitation sites in which metallic impurities are preferentially sequestered.

As discussed above, each of the sequestration sites 14 can be formed as an oxide precipitate and/or associated structural disorder, which can trap atoms of metallic impurities, such as, nickel, copper, chromium, or iron present in the substrate and create an energy barrier that prevents these atoms from leaving the sequestration sites during heat treatments to which the wafer can be subjected during various steps of an IC manufacturing process. This precipitation of metals at these sequestration sites advantageously suppresses their precipitation in the vicinity of the substrate's top surface, and hence lowers the concentration of metallic contaminants in the device layer. The substantially reduced concentration of metallic contaminants in the device layer in turn enhances the performance of electronic devices formed in this layer, for example, by reducing leakage currents associated with such devices.

In contrast, in the absence of the sequestration sites formed in the accordance with the teachings of the invention, metallic impurities can diffuse across the substrate, and even across the continuous oxide layer 26, for example, during high temperature steps to which the substrate will be typically subjected in subsequent integrated circuit (IC) manufacturing procedures. For example, some of these IC manufacturing steps subject the substrate to temperatures in excess of 450 C that can increase the mobility of metallic impurities, thereby facilitating their migration to the device layer. The presence of metallic impurities in the device layer can in turn degrade the performance of devices formed in this layer.

Figure 3A:
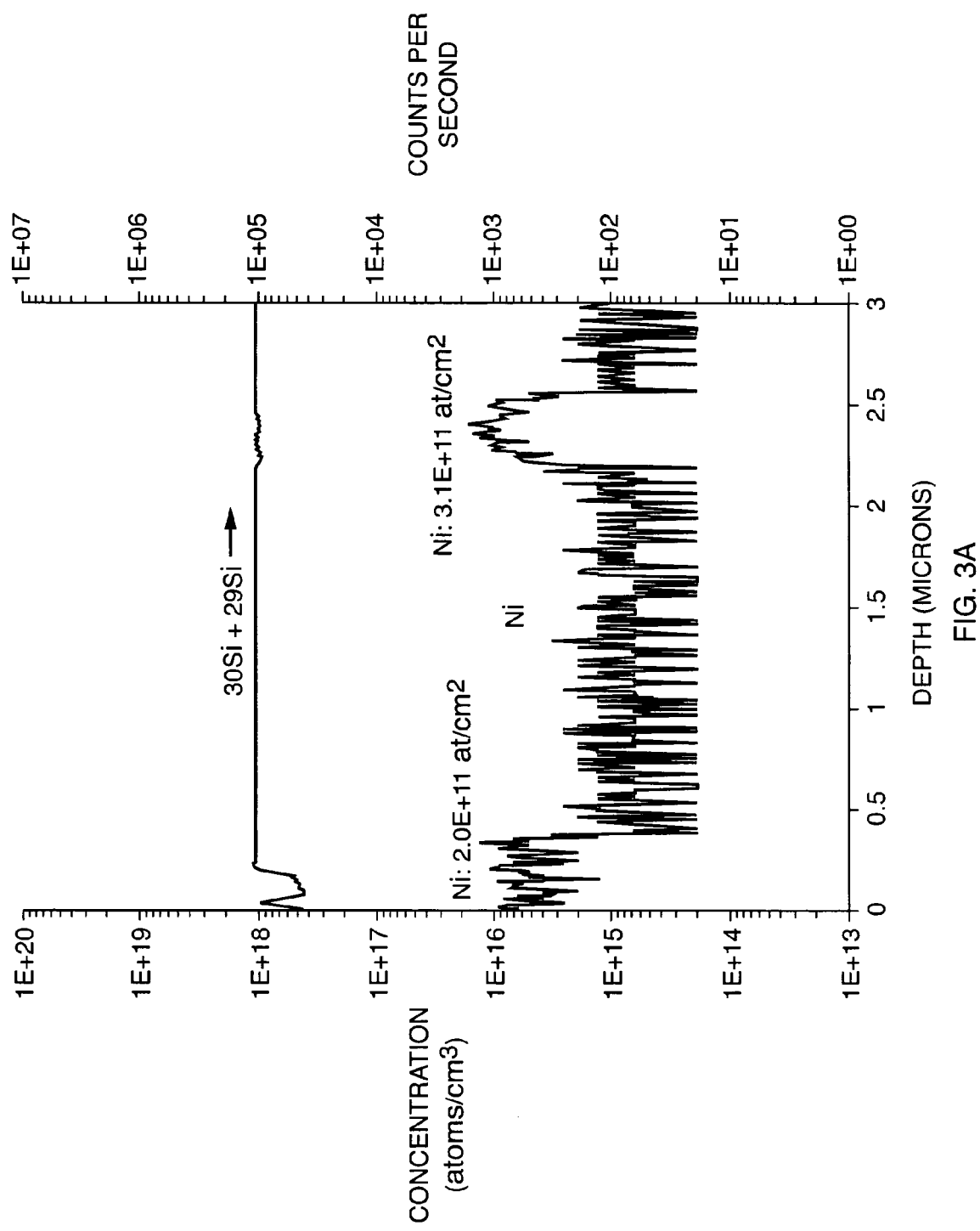
FIG. 3A presents exemplary experimental data depicting the concentration of nickel impurities in an SOI wafer of the invention having an internal gettering layer.

To illustrate the efficacy of the above method of the invention for generating internal sequestration sites for metallic impurities in an SOI wafer, FIG. 3A illustrates experimental data related to concentration of nickel impurities in an SOI wafer in which internal gettering sites according to the above embodiment of the invention are generated. More particularly, these measurements were performed on a silicon wafer in which a gettering layer was generated according to the teachings of the invention by implanting a dose of $1.7 \times 10^{17}$ $cm^{-2}$ oxygen ions therein through exposure to an oxygen ion beam having an energy of about 210 keV. Subsequently, an epi layer, and a continues buried oxide layer within the epi layer, were formed on the wafer in accordance with the above teachings of the invention.

These measurements of concentration of nickel impurities were performed by employing a technique commonly known as secondary ion mass spectrometry (SIMS). As known to those having ordinary skill in the art, in SIMS, a sample under investigation is placed in a vacuum chamber and is bombarded with energetic ions, which are known as primary ions. The primary ions penetrate the sample's near-surface atomic layers to induce a chain of collisions among their atoms, which in turn causes the release, commonly referred to as sputtering, of atoms and/or molecules, known as secondary ions, from these layers. These secondary ions are analyzed by utilizing a mass spectrometer to obtain information regarding the elemental composition of the near-surface layers.

Figure 3B:
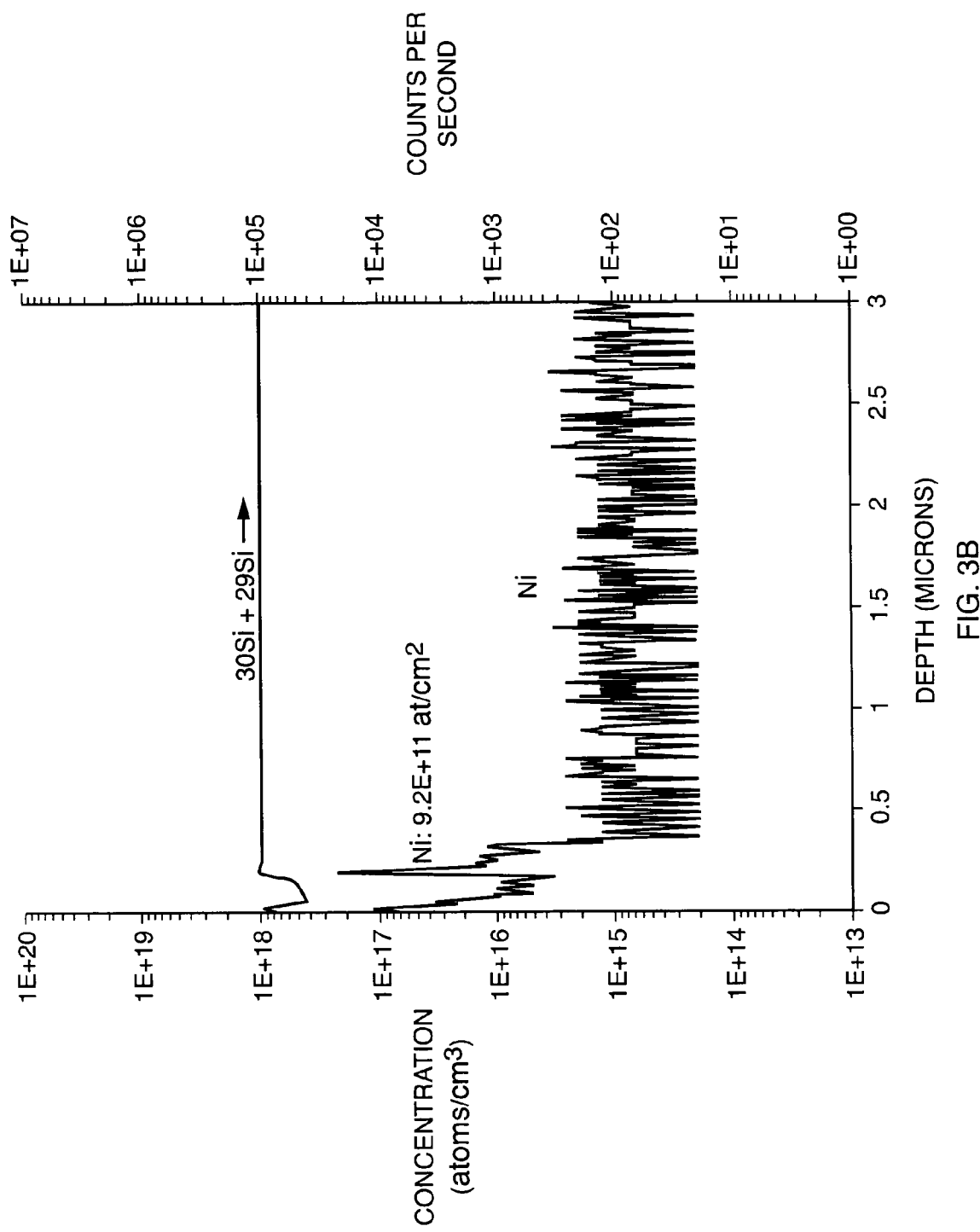
FIG. 3B presents control data depicting concentration of nickel impurities in an SOI wafer having a continuous buried oxide layer formed in an epitaxial layer generated over a substrate's surface but lacking a gettering layer for sequestering metallic impurities.

FIG. 3B illustrates control data obtained by measuring concentration of nickel in a silicon wafer having an epitaxial layer in which a buried continuous oxide layer is formed, but lacking any internal gettering sites, such as the sites 14 (FIG. 2A). In addition, the control wafer did not include a polycrystalline back surface. A comparison of the experimental data presented in FIG. 3A with control data shown in FIG. 3B indicates that the SOI wafer having internal gettering sites exhibits a much decreased nickel concentration relative to the control wafer. In particular, the data in FIG. 3A illustrates that the concentration of nickel in a region of the substrate extending from the substrate's top surface to a depth of about 0.5 microns is approximately $2 \times 10^{11}$ atoms/$cm^2$ while a corresponding nickel concentration in the control wafer is about $9 \times 10^{11}$ atoms/$cm^2$. A peak 32 observed at a depth of about 2.5 microns in the SOI wafer having internal gettering sites appears to correspond to an increased nickel concentration in the gettering layer as a result of sequestration of nickel by oxide precipitates and/or associated structural defects in this layer. Further, the data corresponding to $^{30}Si$ and $^{29}Si$, in both FIG. 3A and FIG. 3B, were obtained for calibration purposes. In other words, the gettering layer formed in the substrate has a gettering efficiency of about 60%, defined herein as a ratio of nickel concentration in the gettering layer relative to the combined concentration of nickel in the gettering layer and the device layer.

Figure 4:
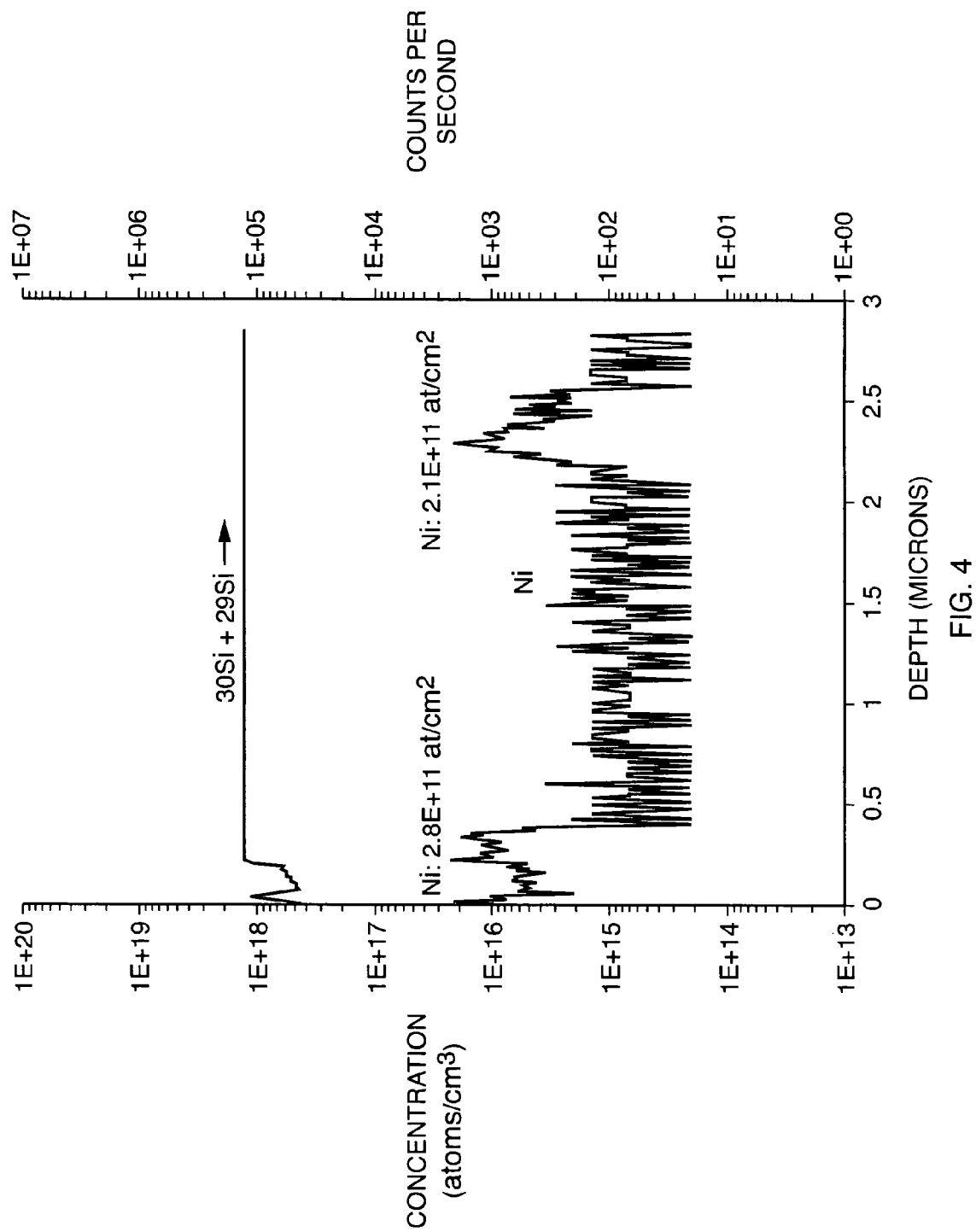

FIG. 4 illustrates experimental data related to concentration of nickel impurities in another SOI wafer in which gettering sites are generated in accordance with teachings of the above embodiment of the invention by utilizing a lower implanted oxygen dose, namely, an oxygen dose of about $5 \times 10^{16}$ $cm^{-2}$. A comparison of the data shown in FIG. 4 with those shown in FIGS. 3A and 3B indicates that the gettering layer formed by employing a lower oxygen dose is effective in lowering the concentration of nickel impurities, albeit with a slightly lower gettering efficiency in comparison with that of the gettering layer formed by utilizing a higher implanted oxygen dose of $1.7 \times 10^{17}$ (FIG. 3A). For example, while the concentration of nickel impurities within a region of this wafer extending from the wafer's top surface to a depth of about 2.5 microns is approximately $2.8 \times 10^1$ atoms/$cm^2$, the corresponding concentration of nickel in the wafer in which gettering sites are formed by employing a higher oxygen dose of $1.7 \times 10^{17}$ $cm^{-2}$ is about $2 \times 10^{11}$ atoms/$cm^2$.

Without being limited to any particular theory, the lower gettering efficiency exhibited by the wafer in which gettering sites are generated by employing a lower oxygen dose (FIG. 4) may be due to a lower number of formed precipitation sites and/or a lower stability exhibited by these sites when the wafer is subjected to elevated annealing temperatures during formation of the epi layer or during the formation of the continuous buried oxide layer within the epi layer.

It should be understood that the above measurements are presented only for illustrative purposes to show the efficacy of gettering layers formed in accordance with the teachings of the invention, and are not intended to present optimal lowering of the concentration of metallic impurities in an SOI wafer by utilizing the above methods of the invention. In particular, a higher decrease in the concentration of metallic impurities may be achieved by varying various parameters, such as, the dose of oxygen ions implanted in the wafer for forming the gettering sites.

Figure 5A:
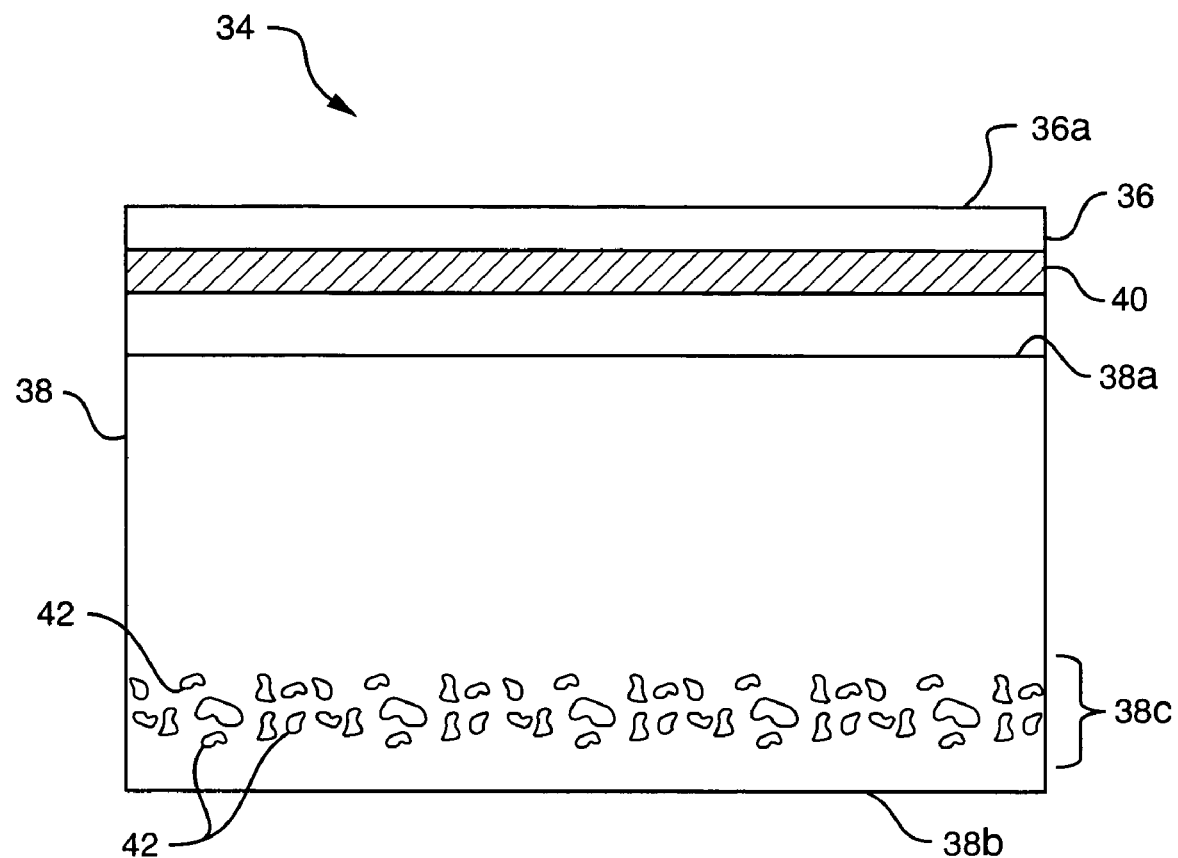
FIG. 5A depicts an SOI wafer formed in accordance with another embodiment of the invention having a gettering layer below a back surface thereof and having a continuous buried oxide layer in an epitaxial silicon layer formed on a top surface opposed to the back surface.

In other embodiments, a plurality of gettering sites for sequestering metallic impurities can be generated in a silicon substrate by ion implantation through the substrate's back surface. By way of example, FIG. 5A schematically depicts an SOI wafer 34 formed in accordance with this aspect of the invention having an epitaxially grown silicon layer 36 formed over a top surface 38a of a silicon substrate 38, and a continuous buried oxide layer 40 generated in the epi layer by utilizing, for example, SIMOX techniques. In addition, the SOI wafer includes a plurality of internal sites 42 disposed below a bottom surface 38b, i.e., a surface opposed to the top surface and also herein referred to as the substrate's back surface, for sequestering metallic impurities The sequestration sites 42 can be distributed about a selected depth, for example, a depth of a few tenths of microns, below the back surface 38b, and can span a region 38c of the substrate having a width in range of about 0.1 to about 1 micron.

With reference to FIG. 5A and FIG. 5B, in one exemplary method for formation of the SOI substrate 34, in a step 44, a dose of oxygen ions is implanted through the back surface 38b of the silicon substrate 38 by exposing the back surface to a beam of oxygen ions having an energy in a range of about 30 keV to about 300 keV, and more preferably, in a range of about 120 keV to about 220 keV. As in the previous embodiment, the implanted oxygen dose can be selected to be in a range of about $5 \times 10^{15}$ $cm^{-2}$ to about $10^{18}$ $cm^{-2}$, and more preferably in a range of about $5 \times 10^{16}$ $cm^{-2}$ to about $2 \times 10^{17}$ $cm^{-2}$. The implanted oxygen ions generate a plurality of oxide precipitates and/or associated structural defects that correspond to the sequestration sites 42.

Subsequently, in another step 46, the epi layer 36 can be formed on the top surface 38a of the substrate 38 by utilizing, for example, well known CVD processes, as described above. This can be followed, in step 48, by the formation of the buried continuous oxide layer 40 in the epi layer 36 by utilizing a SIMOX process. For example, a dose of oxygen ions in a range of about $10^{16}$ $cm^{-2}$ to about $10^{18}$ $cm^{-2}$ can be implanted below the top surface 36a of the epi layer followed by an annealing step at a high temperature, e.g., a temperature in a range of about 1100 C to about 1400 C, to cause the formation of the continuous buried oxide layer 40.

Thus, the above process generates the SOI wafer 34 having a gettering layer in the vicinity of its back surface, and a continuous buried oxide layer 40 below a top surface of the epi layer 36. The continuous buried layer 40 separates an upper region of the epi layer, in which devices can be formed, from the remainder of the wafer.

As in the previous embodiment, the internal sequestering or gettering sites 42 allow preferential precipitation of metallic impurities present in the substrate, thereby lowering the concentration of these metallic impurities in other portions of the substrate. As discussed above, such lowering of the concentration of metallic impurities in the device layer is of particular importance as it can substantially enhance the performance of devices formed in this layer.

It should be understood that although in the above exemplary method for generating the SOI susbtrate 34, the gettering sites were generated prior to formation of the epi layer, in other embodiments, the epi layer and the continuous oxide layer can be first generated followed by the formation of the gettering sites by ion implantation through the substrate's back surface, as described above.

Figure 6:
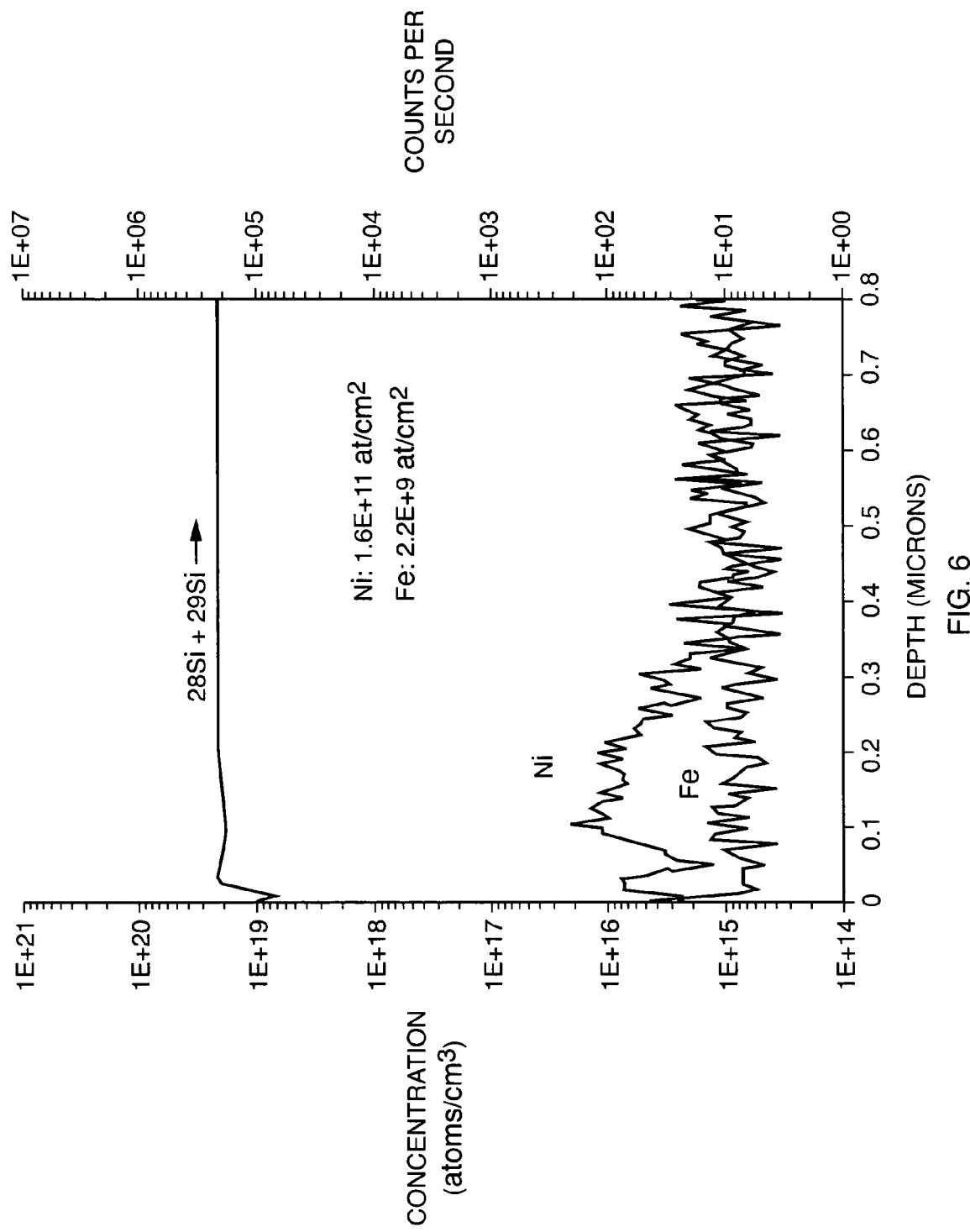
FIG. 6 presents exemplary experimental data depicting concentration of nickel impurities in an SOI wafer, such as the wafer of FIG. 5A, in which an internal gettering layer in vicinity of its back surface is generated in accordance with the teachings of the invention.

FIG. 6 presents exemplary experimental data, obtained by employing a SIMS technique, that is indicative of the efficiency of gettering sites formed below a back surface of a silicon wafer by ion implantation, such as the sites 42 in the substrate 34 (FIG. 5A), for sequestering metallic impurities. These measurements were performed on a wafer in which gettering sites were generated by subjecting its back surface to a beam of oxygen ions having an energy of approximately 212 keV to implant a dose of $1.7 \times 10^{17}$ cm$^{-2}$ of oxygen ions therein. Subsequently, an epi layer was epitaxially grown on the wafer's top surface followed by formation of a continuous buried oxide layer below the epi layer's top surface via a SIMOX process.

A comparison of data depicted in FIG. 6 with control data shown in FIG. 3B indicates a much lower concentration of nickel in the wafer having gettering sites in the vicinity of its back surface. For example, while the control data shows a nickel concentration of approximately $9.2 \times 10^{11}$ atoms/cm$^2$ within a region of the wafer extending from the top surface of the epitaxial layer to a depth of about 0.5 microns, the corresponding data for the SOI wafer formed according to the above embodiment of the invention to include gettering sites in the vicinity of its back surface shows a much lower nickel concentration of about $1.6 \times 10^{11}$ atoms/cm$^2$.

In some embodiments of the invention, subsequent to the formation of internal gettering sites below a silicon wafer's back surface, a continuous buried oxide layer is generated below a top surface of the wafer without forming an epitaxial layer over the top surface.

In some embodiments of the invention, a plurality of gettering sites are generated in a wafer by employing two separate ion implantation steps performed preferably at different energies. By way of example, with reference to FIG. 7 and FIG. 8A, in an initial step 50, a wafer 52 is exposed to a beam of oxygen ions 54 having an energy in a range of about 30 keV to about 300 keV, and more preferably in a range of about 120 keV to about 220 keV, to implant a dose of oxygen in a range of about $5 \times 10^{15}$ cm$^{-2}$ to about $10^{18}$ cm$^{-2}$, and more preferably in a range of about $5 \times 10^{16}$ to $1.5 \times 10^{17}$ cm$^{-2}$, therein. The implanted oxygen ions can exhibit a distribution profile, such as the exemplary profile 56, having a peak at a selected depth beneath a top surface of the wafer. This implantation step generates a plurality of oxygen precipitates and/or associated structural defects 58 within a range of the wafer's depth commensurate with the implantation profile 56.

Figure 7:
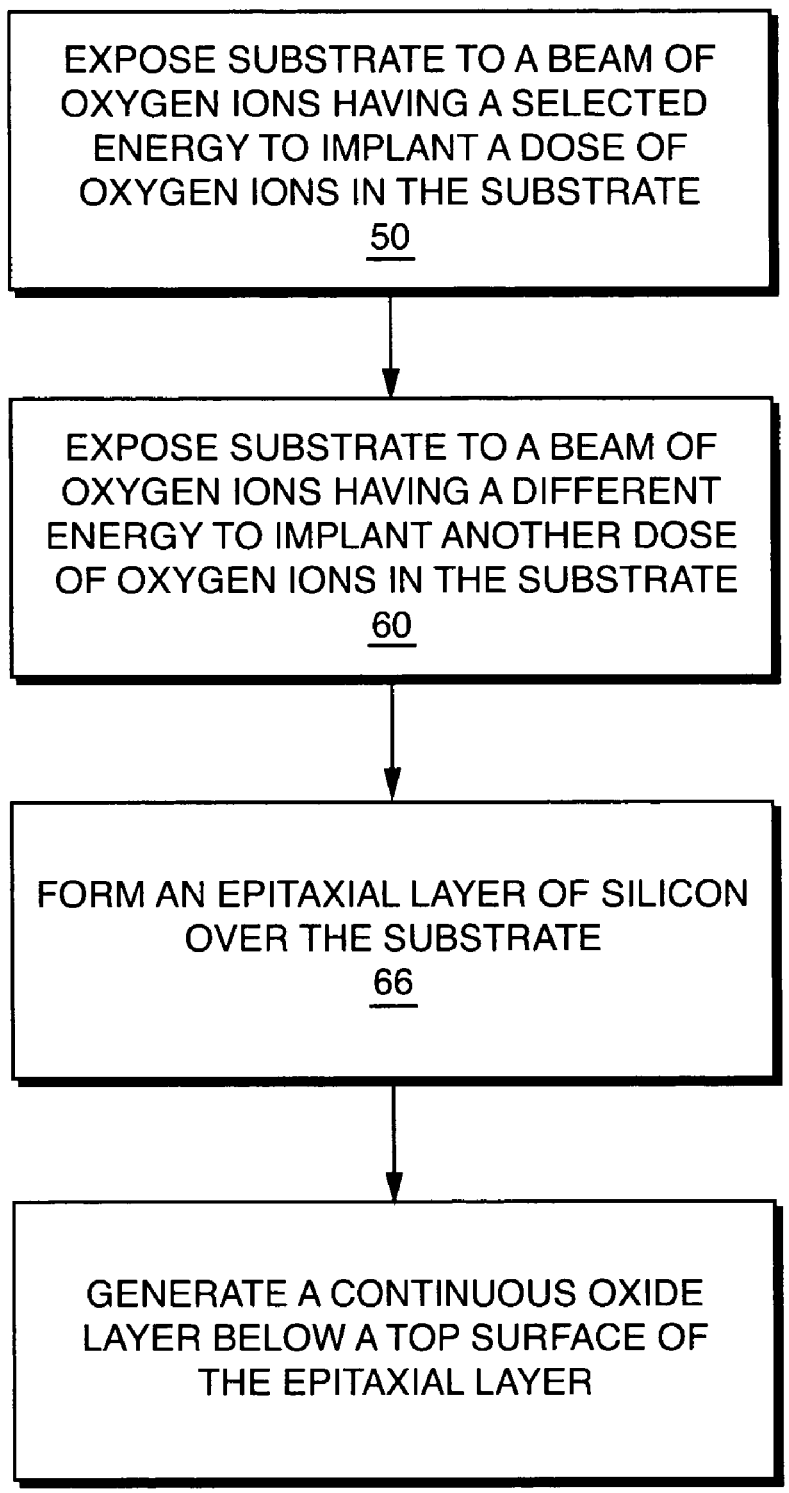
FIG. 7 is a flow chart depicting steps in one embodiment of the invention in which gettering sites are formed in a silicon substrate via multiple ion implantation steps performed preferably at different doses and energies, FIG. 8A schematically depicts a wafer in which a gettering layer is formed by ion implantation in accordance with one embodiment of the invention, FIG. 8B schematically depicts the wafer of FIG. 8A subsequent to a second ion implantation to generate another gettering layer therein, FIG. 8C schematically depicts the wafer of FIG. 8B subsequent to formation of an epitaxial layer over the wafer, FIG. 8D schematically depicts the wafer of FIG. 8C subsequent to the formation of a buried continuous oxide layer within the epitaxial layer by utilizing a SIMOX process.
Figure 8A:
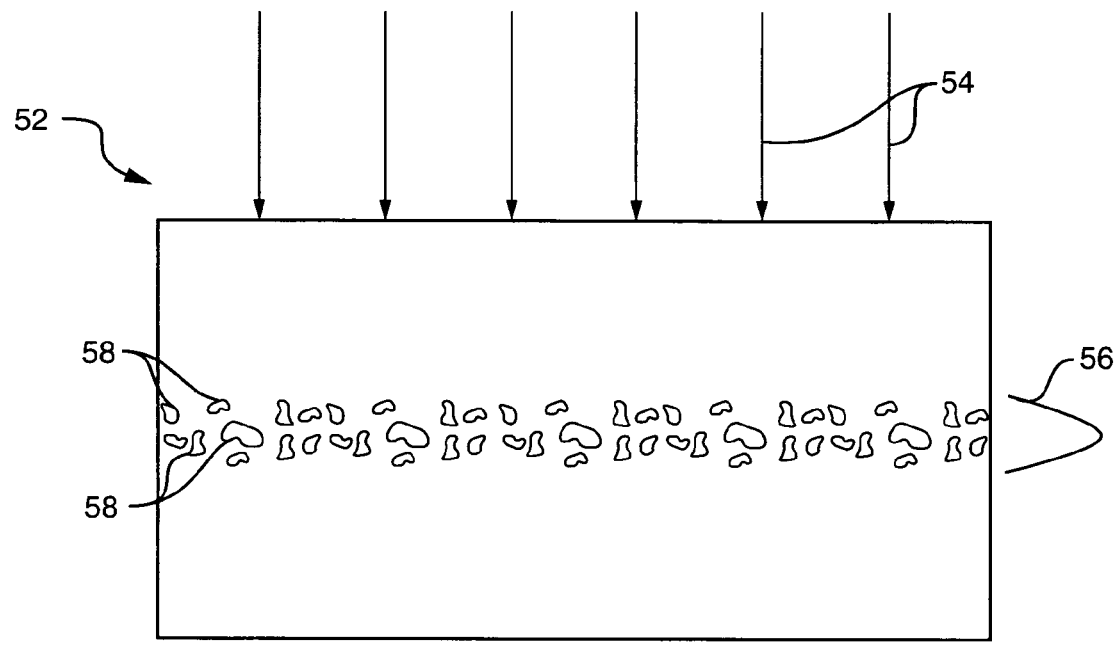
Figure 8B:
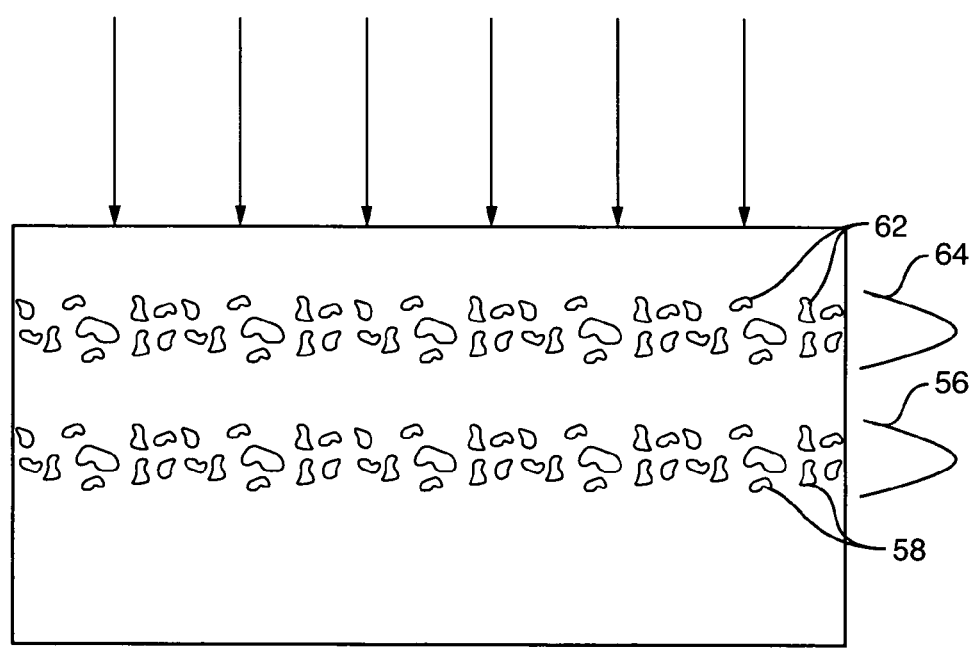

With reference to FIGS. 7 and 8B, subsequently, in step 60, another dose of oxygen ions in a range of about $5 \times 10^{15}$ cm$^{-2}$ to about $10^{18}$ cm$^{-2}$, and more preferably in a range of about $5 \times 10^{16}$ to about $2 \times 10^{17}$ cm$^{-2}$, is implanted in the wafer by exposing it to a beam of oxygen ions having a different energy, typically a lower energy, than that of the beam utilized for the first implantation step. The oxygen beam's energy in the second implantation step can be in a range of about 30 keV to about 300 keV, and more preferably in a range of about 120 keV to about 220 keV. In this example, the second implantation step generates a plurality of oxygen precipitates and/or structural defects 62 distributed over a range of the wafer's depth commensurate with a profile 64 indicative of the distribution of the ions implanted in the second implantation step. This region containing this second set of oxygen precipitates and/or associated structural defects is herein referred to as a second gettering layer. It should be understood that the first and second gettering layers can have some overlap, or may be substantially spatially separated. In addition, similar to the previous embodiments, the sequestration sites in both gettering layers preferably do not form a continuous oxide layer, but rather are in the form of separate precipitates to present a higher surface area for precipitation of metallic impurities present in the substrate.

Figure 8C:
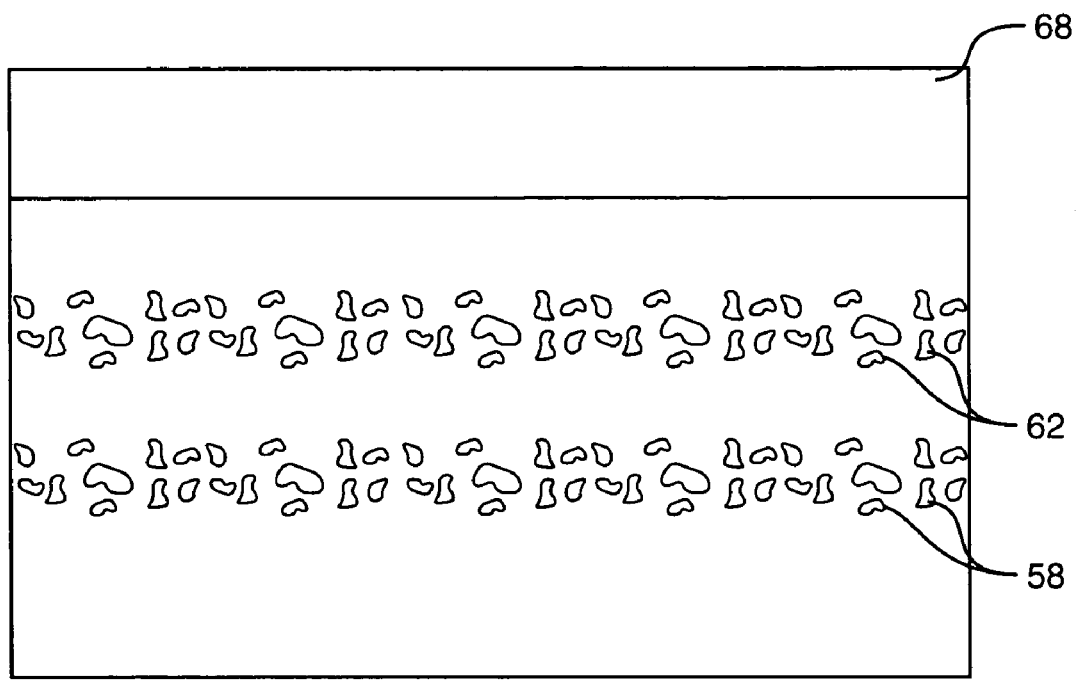
Figure 8D:
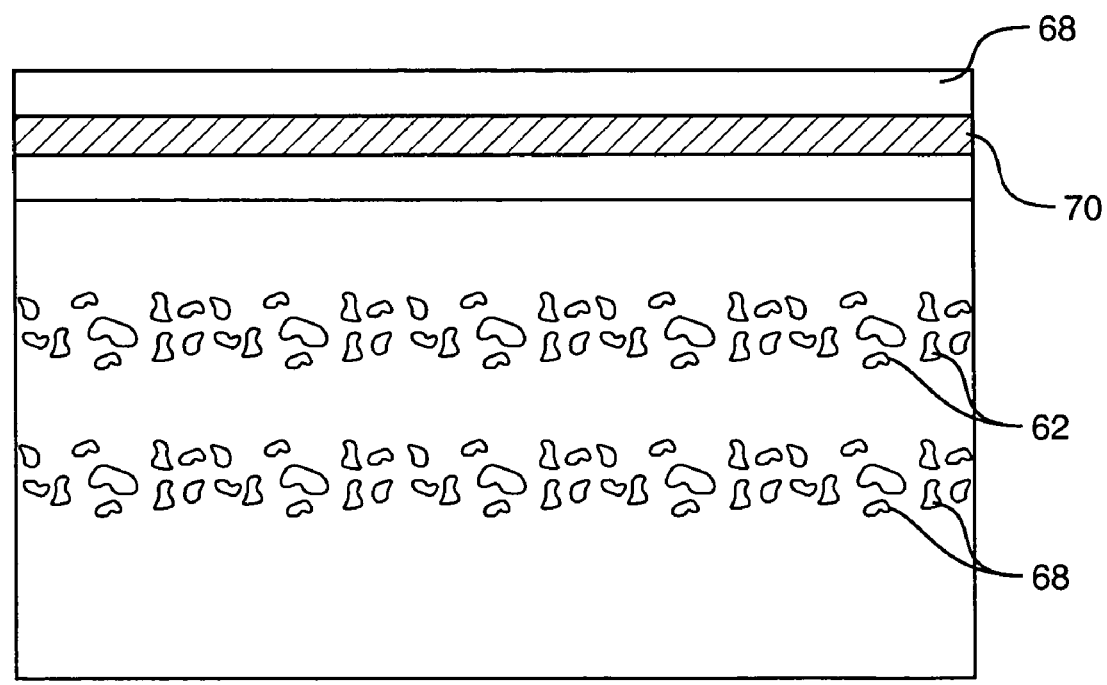

Referring to FIGS. 7, 8C and 8D, subsequent to the formation of the two gettering layers, in step 66, an epitaxial layer 68 of silicon is formed over the substrate's top surface, for example, by utilizing known deposition techniques, as described above. A continuous buried oxide layer 70 can then be generated at a selected depth below a top surface of the epi layer by employing, e.g., a SIMOX process.

Figure 9:
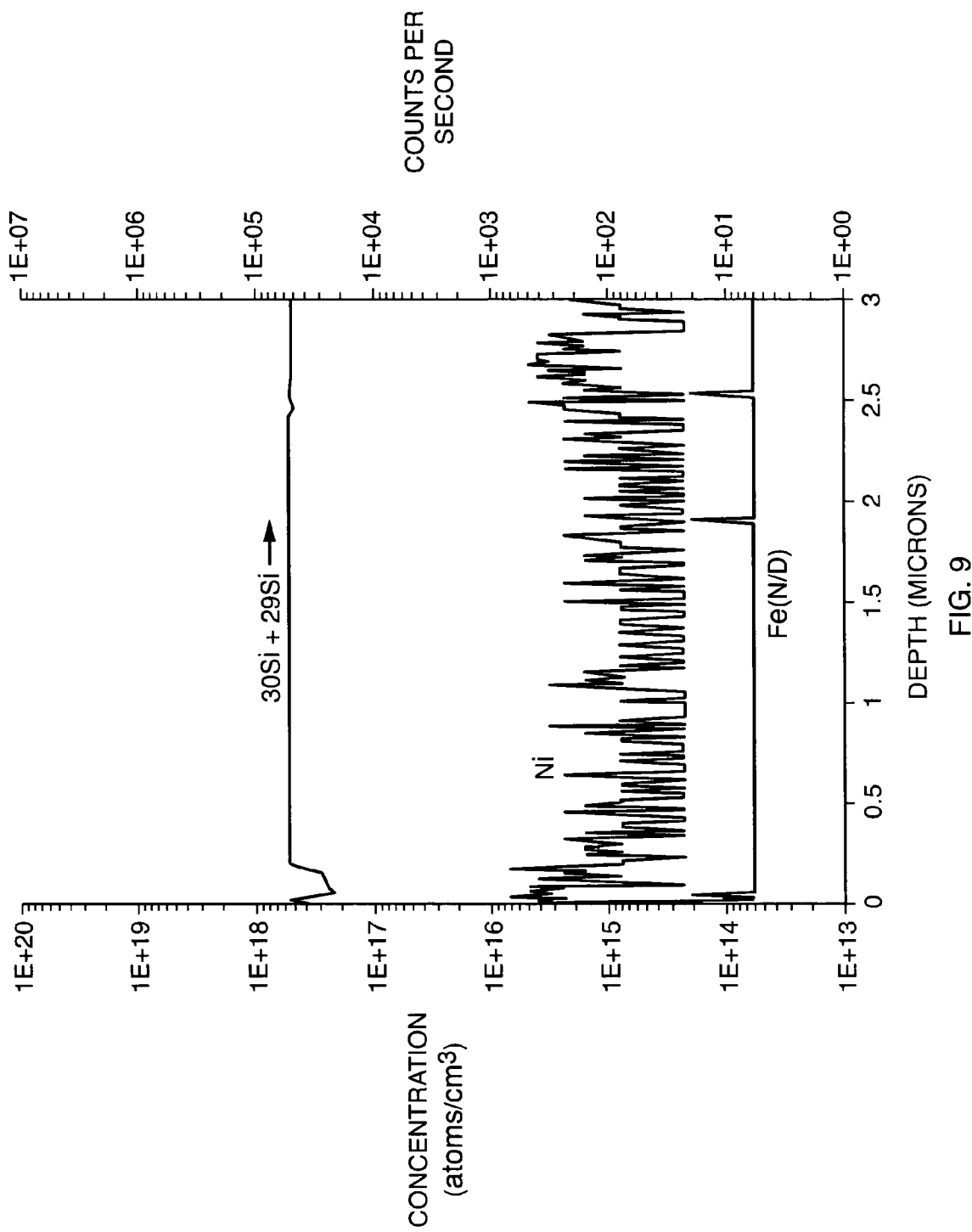
FIG. 9 presents exemplary experimental data illustrating concentration of nickel impurities in a wafer of the invention, such as the wafer of FIG. 8D, in which two gettering layers are formed.

By way of example, FIG. 9 illustrates experimental data regarding concentration of nickel impurity in an exemplary SOI wafer according to the teachings of the invention in which gettering sites are generated by employing two ion implantation steps as described above. The gettering sites in the SOI wafer were generated by initially implanting a dose of about $7 \times 10^{16}$ cm$^{-2}$ of oxygen ions in the wafer, via exposure of the wafer to an oxygen beam having an energy of about 212 keV, and subsequently, implanting another dose of $1 \times 10^{17}$ cm$^{-2}$ of oxygen ions therein by exposing it to an oxygen beam having an energy of about 150 keV. The illustrated data shows that the nickel concentration in this wafer within a depth of about 0.4 microns is approximately $3 \times 10^{10}$ atoms/cm$^2$. Similar to previous experimental data, it should be understood that this experimental data is not intended to present an optimal gettering efficiency that can be achieved in an SOI wafer of the invention via multiple ion implantation steps performed at different energies. In particular, the implantation energies and/or the implanted oxygen doses can be varied within the above ranges to optimize the efficiency of the generated gettering sites in sequestering metallic impurities present in the substrate. Further, although two implantation steps were utilized in the above embodiment of the invention, in other embodiments three or more implantation steps can be employed, preferably at different energies, to generate three or more gettering layers for sequestering metallic impurities.

Applicants have found that gettering efficiency is typically higher in wafers in which gettering sites are formed via two implantation steps at different energies rather than in one implantation step.

Although the above embodiments of the invention were described with reference to silicon wafers, the above methods of the invention can also be employed to form gettering layers for sequestering metallic impurities in other types of semiconductor substrates, such as, silicon-germanium substrates.

Those having ordinary skill in the art will appreciate that various modifications can be made to the above embodiments without departing from the scope of the invention.

What is claimed is:

1. A method for processing a silicon substrate, comprising the steps of implanting a first dose of oxygen ions in a range of about $5 \times 10^{16}$ cm$^{-2}$ to about $2 \times 10^{17}$ cm$^{-2}$ into the substrate so as to generate a plurality of sites for sequestering metallic impurities present in said substrate, implanting a second dose of oxygen ions greater than the first dose in said substrate to generate a buried oxygen-rich layer, and subsequent to said two implantation steps, annealing said substrate to generate a continuous buried oxide layer in said oxygen-rich layer.

2. The method of claim 1, wherein said plurality of sites comprise precipitation sites and/or associated structural defects generated by interaction of said implanted ions for generating said sequestering sites within said substrate.

3. The method of claim 1, wherein the annealing step comprises maintaining the substrate at a temperature in a range of about 1150 C to about 1400 C for period of a few hours.

4. A method for processing a silicon substrate, comprising the steps of:

implanting a dose of oxygen ions into the substrate by exposing the substrate to oxygen ions having a first energy so as to generate a plurality of sites for sequestering metallic impurities present in said substrate, implanting a separate dose of oxygen ions in said substrate by exposing the substrate to oxygen ions having a second energy lower than the first energy so as to generate another set of sites for sequestering metallic impurities present in said substrate at a different depth, forming a buried oxygen-rich layer, and annealing said substrate to generate a continuous buried oxide layer in said oxygen-rich layer, wherein the doses of said implanted oxygen ions for generating sequestering sites are selected such that said sequestering sites are capable of substantially withstanding said annealing step.

5. The method of claim 4, wherein said sequestering sites comprise oxide precipitates.

6. The method of claim 4, wherein each of the steps of implanting oxygen ions comprises exposing the substrate to a beam of oxygen ions having an energy in a range of about 30 to about 300 keV.

7. The method of claim 4, further comprising selecting the implanted oxygen dose for generating the sequestration sites to be in a range of about $5 \times 10^{16}$ cm$^{-2}$ to about $2 \times 10^{17}$ cm$^{-2}$.

8. The method of claim 7, further comprising selecting the implanted oxygen dose for generating the sequestration sites to be in a range of about $5 \times 10^{16}$ cm$^{-2}$ to about $1 \times 10^{17}$ cm$^{-2}$.

9. The method of claim 7, wherein the step of forming the buried oxygen rich layer comprises implanting an oxygen dose in the substrate greater than said implanted oxygen doses for generating the sequestration sites.

10. A method for processing a silicon substrate, comprising the steps of:

generating a plurality of sites for gettering metallic impurities below a surface of the substrate by implanting a dose of oxygen ions in a range of about $5 \times 10^{16}$ cm$^{-2}$ to about $2 \times 10^{17}$ cm$^{-2}$ therein, subsequent to said implantation step, growing an epitaxial layer of crystalline silicon over said substrate surface, and generating a continuous insulating layer in said crystalline epitaxial silicon layer.

11. The method of claim 10, further comprising selecting a dose of implanted oxygen ions to be in a range of about $5 \times 10^{16}$ cm$^{-2}$ to about $1 \times 10^{17}$ cm$^{-2}$.

12. The method of claim 10, wherein the step of implanting a dose of oxygen ions comprises exposing the substrate to a beam of oxygen ions having an energy in a range of about 30 to about 300 keV.

13. The method of claim 10, wherein the step of generating a continuous insulating layer comprises implanting a dose of oxygen ions in said epitaxial layer to generate a damaged buried layer, and annealing said substrate at an elevated temperature to generate a continuous insulating layer in said buried damaged layer.

14. The method of claim 13, further comprising selecting said dose of implanted oxygen for generating a buried damaged layer to be in a range of about $10^{16}$ to about $10^{18}$ cm$^{-2}$.

15. The method of claim 13, wherein said annealing step comprises maintaining said substrate at a temperature in a range of about 1100 C to about 1400 C for a time period of hours.

16. A method for processing a silicon substrate, comprising the steps of implanting a first dose of oxygen ions in a range of about $5 \times 10^{16}$ cm$^{-2}$ to about $2 \times 10^{17}$ cm$^{-2}$ through a first surface of the substrate to generate a plurality of sites for gettering metallic impurities in a region below said first surface, growing an epitaxial crystalline layer of silicon over a second surface of the substrate opposed to said first surface, generating a buried continuous oxide layer within said epitaxial layer of silicon.

17. The method of claim 16, wherein the step of generating a buried continuous oxide layer comprises:

implanting a second dose of oxygen ions through a top surface of said epitaxial layer to generate a buried oxygen-rich layer, and annealing said substrate at an elevated temperature to generate said continuous oxide layer within said buried oxygen rich layer.

18. The method of claim 17, further comprising selecting said second dose of oxygen ions to be greater than said first dose.

19. The method of claim 17, wherein said annealing step comprises maintaining said substrate at a temperature in a range of about 1100 C to about 1400 C for a time period of hours.

20. A method of generating an SOI wafer, comprising generating a first set of sequestration sites for gettering metallic impurities in a silicon wafer by exposing said wafer to a beam of oxygen ions having a first energy to implant a first dose of oxygen ions in a range of about $5 \times 10^{16}$ cm$^{-2}$ to about $2 \times 10^{17}$ cm$^{-2}$ therein, generating a second set of sequestration sites in said wafer by exposing the wafer to a beam of oxygen ions having a second energy different than said first energy to implant a second dose of oxygen ions in a range of about $5 \times 10^{16}$ to about $2 \times 10^{17}$ therein, forming an epitaxial layer of silicon over said wafer, and generating a buried continuous oxide layer in said epitaxial layer.

21. The method of claim 20, wherein said first oxygen dose is selected to be in a range of about $5 \times 10^{16}$ to about $1 \times 10^{17}$ cm$^{-2}$.

22. The method of claim 21, wherein said second oxygen dose is selected to be in a range of about $5 \times 10^{16}$ to about $1 \times 10^{17}$ cm$^{-2}$.

23. The method of claim 22, wherein a sum of said first oxygen dose and said second oxygen dose is selected to be in a range of about $1 \times 10^{17}$ to about $4 \times 10^{17}$ cm$^{-2}$.

24. The method of claim 20, wherein the step of generating a buried continuous oxide layer in said epitaxial layer comprises
   implanting a selected dose of oxygen ions in said epitaxial layer to generate a buried oxygen-rich layer therein, and
   annealing said wafer to cause formation of a buried continuous oxide layer within said oxygen-rich layer.

25. The method of claim 24, wherein said annealing step comprises maintaining said wafer at an elevated temperature in a range of about 1100 C to about 1400 C for a time period in a range of about 2 hours to about 16 hours.

26. An SOI wafer, comprising
   a silicon substrate,
   a continuous buried oxide layer formed below a surface of said substrate,
   at least two buried gettering layers, each having a plurality of oxide precipitate sites for preferential sequestration of metallic impurities.

27. A method for processing a silicon substrate, comprising the steps of
   implanting a first dose of oxygen ions in a range of about $5\times10^{16}$ cm$^{-2}$ to about $2\times10^{17}$ cm$^{-2}$ into the substrate so as to generate a plurality of sites for sequestering metallic impurities present in said substrate,
   implanting a second dose of oxygen ions in said substrate to generate a buried oxygen-rich layer, and
   subsequent to said two implantation steps, annealing said substrate to generate a continuous buried oxide layer in said oxygen-rich layer.

* * * * *